US012744525B2

(12) United States Patent
Iizuka et al.

(10) Patent No.: US 12,744,525 B2
(45) Date of Patent: Sep. 22, 2026

(54) CHARGE PUMP SYSTEM

(71) Applicant: Samsung Electro-Mechanics Co., Ltd., Suwon-si (KR)

(72) Inventors: Shinichi Iizuka, Suwon-si (KR); Youngwong Jang, Suwon-si (KR); Jongok Ha, Suwon-si (KR); Hyejin Lee, Suwon-si (KR); Jeonghoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 422 days.

(21) Appl. No.: 18/385,451

(22) Filed: Oct. 31, 2023

(65) Prior Publication Data

US 2024/0275380 A1 Aug. 15, 2024

(30) Foreign Application Priority Data

Feb. 9, 2023 (KR) ........................ 10-2023-0017566

(51) Int. Cl.

*H03F 1/26* (2006.01)
*H03F 3/45* (2006.01)
*H03K 17/16* (2006.01)
*H03K 17/687* (2006.01)

(52) U.S. Cl.

CPC ............. *H03K 17/687* (2013.01); *H03F 1/26* (2013.01); *H03F 3/45475* (2013.01); *H03K 17/162* (2013.01); *H03F 2200/451* (2013.01)

(58) Field of Classification Search

CPC .......... H03F 1/26; H03F 3/45475; H03F 3/70; H03K 17/687; H03K 17/162; H02M 3/07; H02M 3/071; H02M 1/08

USPC ........................................ 330/291, 297, 285

See application file for complete search history.

(56) References Cited

U.S. PATENT DOCUMENTS

| | | | | |
|---|---|---|---|---|
| 8,344,791 | B2 | 1/2013 | Adkins et al. | |
| 8,350,544 | B2 | 1/2013 | Yen et al. | |
| 2021/0405674 | A1 | 12/2021 | Xue et al. | |
| 2022/0147087 | A1 * | 5/2022 | Mayerl | G01R 19/1659 |

* cited by examiner

*Primary Examiner* — Andrea Lindgren Baltzell
*Assistant Examiner* — Khiem D Nguyen
(74) *Attorney, Agent, or Firm* — NSIP Law

(57) ABSTRACT

A charge pump system includes a charge pump circuit including an input terminal configured to receive an input voltage and an output terminal configured to output an output voltage, and configured to convert the input voltage to the output voltage; a first resistor including one terminal connected to a reference voltage; a second resistor connected between another terminal of the first resistor and the charge pump circuit output terminal; a third resistor including one terminal connected to the reference voltage; a fourth resistor connected between another terminal of the third resistor and a ground; an amplifier including a first input terminal connected to the other terminal of the first resistor, a second input terminal connected to the other terminal of the third resistor; and a first transistor including a control terminal connected to an amplifier output terminal, and a first terminal connected to the charge pump circuit input terminal.

13 Claims, 4 Drawing Sheets

CHARGE PUMP SYSTEM

CROSS-REFERENCE TO RELATED APPLICATIONS

This application claims the benefit under 35 USC 119(a) of Korean Patent Application No. 10-2023-0017566 filed on Feb. 9, 2023, in the Korean Intellectual Property Office, the entire disclosure of which is incorporated herein by reference for all purposes.

BACKGROUND

1. Field

The present disclosure relates to a charge pump system.

2. Description of Related Art

A radio-frequency (RF) switch is a part used in a transmitting end and a receiving end of a communication module, and it transmits or blocks RF signals. The RF switch may select frequency bands. The RF switch circuit is developing very fast according to down-sizing and high-performance trends.

The RF switch may be implemented as a switching transistor that performs a switching function. The switch transistor performs an on/off operation by a control voltage input to a control terminal. The switch transistor may be turned on when the control voltage is a positive (+) voltage, and the transistor may be turned off when the control voltage is a negative (−) voltage. When the control voltage has the negative (−) voltage, the switch transistor may be turned off more reliably. A charge pump circuit that generates a negative (−) voltage may be used so that the control voltage may have the negative (−) voltage.

The charge pump circuit receives a power source voltage and operates according to a clock signal to convert a power source voltage into an output voltage. Deviations may occur in the output voltage depending on the manufacturing process of the charge pump circuit and an external temperature. To prevent this, the power source voltage needs to be high voltage while having a margin. When the power source voltage has a high voltage, a lot of flow-through current may flow in the charge pump circuit, and thus a clock noise may increase. This clock noise may affect the output voltage.

The above information disclosed in this Background section is only for enhancement of understanding of the background of the disclosure of this application, and therefore it may contain information that does not constitute prior art that is already known to a person of ordinary skill in the art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a charge pump system includes a charge pump circuit including an input terminal configured to receive an input voltage, and an output terminal configured to output an output voltage, the charge pump circuit being configured to convert the input voltage to the output voltage; a first resistor including one terminal connected to a reference voltage; a second resistor connected between another terminal of the first resistor and the output terminal of the charge pump circuit; a third resistor including one terminal connected to the reference voltage; a fourth resistor connected between another terminal of the third resistor and a ground; an amplifier including a first input terminal connected to the other terminal of the first resistor, a second input terminal connected to the other terminal of the third resistor, and an output terminal; and a first transistor including a control terminal connected to the output terminal of the amplifier, and a first terminal connected to the input terminal of the charge pump circuit.

The output voltage of the charge pump circuit may depend on a value of the reference voltage and resistance values of the first to fourth resistors.

A voltage at a node between the first resistor and the second resistor may be applied to the first input terminal of the amplifier, and a voltage at a node between the third resistor and the fourth resistor may be applied to the second input terminal of the amplifier.

The first transistor may be configured to supply the input voltage of the charge pump circuit to the input terminal of the charge pump circuit through the first terminal of the first transistor.

The first transistor may further include a second terminal configured to be connected to a power source voltage.

The control terminal of the first transistor may be a gate, the first terminal of the first transistor may be a drain, and the second terminal of the first transistor may be a source.

The reference voltage may be a power source voltage supplied from outside the charge pump system.

The input voltage of the charge pump circuit may be a positive voltage, and the output voltage of the charge pump circuit may be a negative voltage.

The amplifier may be an operational amplifier, the first input terminal of the amplifier may be a non-inverting terminal of the operational amplifier, and the second input terminal of the amplifier may be an inverting terminal of the operational amplifier.

In another general aspect, a charge pump system includes a charge pump circuit including an input terminal configured to receive an input voltage, and an output terminal configured to output an output voltage, the charge pump circuit being configured to convert the input voltage to the output voltage; a transistor including a control terminal configured to receive a control voltage, and a first terminal connected to the input terminal of the charge pump circuit to provide the input voltage to the input terminal of the charge pump circuit, the transistor being configured to generate the input voltage based on the control voltage; an amplifier including a first input terminal configured to receive a feedback voltage, a second input terminal configured to receive a first reference voltage, and an output terminal connected to the control terminal of the transistor to provide the control voltage to the control terminal of the transistor, the amplifier being configured to generate the control voltage based on the feedback voltage and the first reference voltage; a first voltage divider connected between a terminal configured to receive a second reference voltage and the output terminal of the charge pump circuit and configured to generate the feedback voltage and output the feedback voltage to the first input terminal of the amplifier; and a second voltage divider connected between the terminal configured to receive the second reference voltage and a ground and configured to generate the first reference voltage and output the first reference voltage to the second input terminal of the amplifier.

The amplifier may be an operational amplifier, the first input terminal of the amplifier may be a non-inverting input terminal of the operational amplifier configured to receive the feedback voltage, the second input terminal of the amplifier may be an inverting input terminal of the operational amplifier configured to receive the first reference voltage, and the operational amplifier may be configured to generate the control voltage based on the feedback voltage and the first reference voltage.

The first voltage divider may include a first resistor connected between the terminal configured to receive the second reference voltage and a first node connected to the first terminal of the amplifier; and a second resistor connected between the first node and the output terminal of the charge pump circuit, wherein the first voltage divider may be configured to generate the feedback voltage at the first node based on a first voltage difference between the second reference voltage and the output voltage of the charge pump circuit output from the output terminal of the charge pump circuit, and the second voltage divider may include a third resistor connected between the terminal configured to receive the second reference voltage and a second node connected to the second input terminal of the amplifier; and a fourth resistor connected between the second node and the ground, wherein the second voltage divider may be configured to generate the first reference voltage at the second node based on a second voltage difference between the second reference voltage and a voltage of the ground.

The input voltage of the charge pump circuit may be a positive voltage, and the output voltage of the charge pump system may be a negative voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
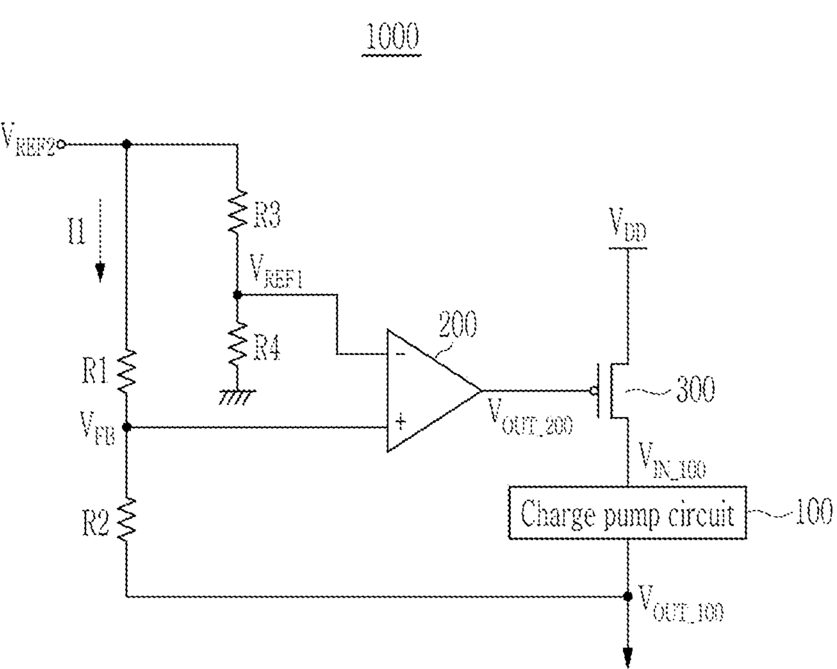
FIG. 1 is a diagram showing a charge pump system according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The use of the term "may" with respect to an example or embodiment, e.g., as to what an example or embodiment may include or implement, means that at least one example or embodiment exists in which such a feature is included or implemented, while all examples and embodiments are not necessarily limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this application, an RF signal may have a format according to Wi-Fi (IEEE 802.11 family, etc.), WiMAX (IEEE 802.16 family, etc.), IEEE 802.20, LTE (long-term evolution), EV-DO, HSPA, HSPA+, HSDPA, HSUPA, EDGE, GSM, GPS, GPRS, CDMA, TDMA, DECT, Bluetooth, 3G, 4G, 5G, and any other wireless and wired protocols designated hereafter, but is not limited thereto.

FIG. 1 is a diagram showing a charge pump system according to an embodiment.

Referring to FIG. 1, a charge pump system 1000 according to an embodiment may include a charge pump circuit 100, an amplifier 200, a transistor 300, a resistor R1, a resistor R2, a resistor R3, and a resistor R4.

The charge pump circuit 100 revives an input voltage $V_{IN\_100}$ from the transistor 300 and may convert the input voltage $V_{IN\_100}$ into an output voltage $V_{OUT\_100}$. The input voltage $V_{IN\_100}$ may be a power source voltage of the charge pump circuit 100.

The charge pump circuit 100 may include an input terminal to which the input voltage $V_{IN\_100}$ is input, and an output terminal to output the output voltage $V_{OUT\_100}$. A transistor disposed inside the charge pump circuit 100 (not shown in FIG. 1, but see FIG. 2) is operated by a clock signal CLK (not shown in FIG. 1, but see FIG. 2), and the charge pump circuit 100 may convert the input voltage $V_{IN\_100}$ into the output voltage $V_{OUT\_100}$. The input voltage $V_{IN\_100}$ may have a positive (+) value, and the output voltage $V_{OUT\_100}$ may have a negative (−) value. The output voltage $V_{OUT\_100}$ may be used to turn on or turn off an RF switch (not shown). Also, the output voltage $V_{OUT\_100}$ may be fed back to the amplifier 200 through the resistor R2. The specific configuration and operation of the charge pump circuit 100 is described in FIG. 2 in detail.

A reference voltage $V_{REF2}$ may be input from outside the charge pump system 1000. As one example, the reference voltage $V_{REF2}$ may be input from a bandgap reference circuit (not shown in FIG. 1). That is, the bandgap reference circuit may generate a reference voltage $V_{REF2}$ to be provided to the charge pump system 1000.

Between the reference voltage $V_{REF2}$ and a ground, the resistor R3 and the resistor R4 may be connected in series. That is, one terminal of the resistor R3 may be connected to the reference voltage $V_{REF2}$, one terminal of the resistor R4 may be connected to the other terminal of the resistor R3, and the other terminal of the resistor R4 may be connected to the ground. A node between the resistor R3 and the resistor R4 may be connected to an inverting terminal (−) of the amplifier 200. That is, the other terminal of the resistor R3 and the one terminal of the resistor R4 may be connected to the inverting terminal (−) of the amplifier 200.

In FIG. 1, a voltage of the node between the resistor R3 and the resistor R4 is denoted as a reference voltage $V_{REF1}$. The reference voltage $V_{REF1}$ may be input to the inverting terminal (−) of the amplifier 200. The reference voltage $V_{REF1}$ input to the inverting terminal (−) of the amplifier 200 is not supplied from the outside, but is generated through the reference voltage $V_{REF2}$ and the resistors R3 and R4.

The reference voltage $V_{REF1}$ may be expressed by Equation 1 below.

$$V_{REF1} = \frac{R4}{(R3 + R4)} \cdot V_{REF2} \tag{1}$$

Between the reference voltage $V_{REF2}$ and the output voltage $V_{OUT\_100}$, the resistor R1 and the resistor R2 may be connected. That is, one terminal of the resistor R1 may be connected to the reference voltage $V_{REF2}$, and one terminal of the resistor R2 may be connected to the other terminal of the resistor R1. The other terminal of the resistor R2 may be connected to the output voltage $V_{OUT\_100}$. A node between the resistor R1 and the resistor R2 may be connected to a non-inverting terminal (+) of the amplifier 200. That is, the other terminal of the resistor R1 and the one terminal of the resistor R2 may be connected to the non-inverting terminal (+) of the amplifier 200.

In FIG. 1, a voltage at the node between the resistor R1 and the resistor R2 is denoted as a feedback voltage $V_{FB}$. The feedback voltage $V_{FB}$ may be input to the non-inverting terminal (+) of the amplifier 200.

The amplifier 200 may include the non-inverting terminal (+), the inverting terminal (−), and an output terminal. The feedback voltage $V_{FB}$ may be input to the non-inverting terminal (+) of the amplifier 200, and the reference voltage $V_{REF1}$ may be input to the inverting terminal (−) of the amplifier 200. The amplifier 200 may output the output voltage $V_{OUT\_200}$ to the output terminal, and the output voltage $V_{OUT\_200}$ may be applied to a control terminal (a gate terminal) of the transistor 300. The amplifier 200 may be an operational amplifier OP AMP. By the operation of the amplifier 200, the reference voltage $V_{REF1}$ and the feedback voltage $V_{FB}$ may be set to the same voltage.

Also, by the operation of the amplifier 200, the output voltage $V_{OUT\_200}$ may be set so that the reference voltage $V_{REF1}$ and the feedback voltage $V_{FB}$ have the same voltage as each other.

In FIG. 1, as one example, the transistor 300 may be a field-effect transistor (FET). Also, the transistor 300 may be any of a variety of transistors such as a bipolar junction transistor (BJT). Also, FIG. 1 shows the transistor 300 as a P-type transistor, but it may be an N-type transistor. In the following description, it is assumed that the transistor 300 is an FET for convenience of explanation, but it may be replaced with another type of transistor. Since the gate of the transistor serves as a control terminal, it may be referred to as a control terminal. Since the source of the transistor is one terminal of the transistor, it may be referred to as a first terminal or a second terminal. Also, since the drain of the transistor is also one terminal of the transistor, it may be referred to as a second terminal or a first terminal.

The source of the transistor 300 may be connected to a power source voltage VDD, and the gate of the transistor 300 may be connected to the output terminal of the amplifier 200. Also, the drain of the transistor 300 may supply the input voltage $V_{IN\_100}$ to the charge pump circuit 100. The gate of the transistor 300 receives the output voltage $V_{OUT\_200}$ from the amplifier 200, and the transistor 300 is turned on or turned off depending on the output voltage $V_{OUT\_200}$. That is, the transistor 300 may be operated as a switch. A voltage drop is generated by the turning-on of the transistor 300, accordingly the input voltage $V_{IN\_100}$ (i.e., the drain voltage of the transistor 300) may be a voltage lower than the power source voltage VDD. As one example, the power source voltage VDD may be a battery voltage.

In FIG. 1, by the operation of the amplifier 200, the voltage at the non-inverting terminal (+) of the amplifier 200 may be the same as the voltage at the inverting terminal (−) of the amplifier 200. Accordingly, the feedback voltage $V_{FB}$ may be expressed by Equation 2 below.

$$V_{FB} = V_{REF1} \tag{2}$$

Because $V_{FB}=V_{REF1}$, a current I1 flowing through the resistor R1 may be expressed by Equation 3 below.

$$I1 = \frac{V_{REF2} - V_{REF1}}{R1} \tag{3}$$

The current I1 also flows through the resistor R2, and the output voltage $V_{OUT\_100}$ may be expressed by Equation 4 below.

$$V_{OUT\_100} = V_{REF2} - I1 \times (R1 + R2) \tag{4}$$

If I1 in Equation is replaced by Equation 3, the output voltage $V_{OUT\_100}$ may be expressed by Equation 5 below.

$$V_{OUT\_100} = \frac{\{(R1 + R2) \cdot V_{REF1} - R2 \cdot V_{REF2}\}}{R1} \tag{5}$$

Referring to Equation 5, the output voltage $V_{OUT\_100}$ may be determined by the reference voltage $V_{REF1}$, the reference voltage $V_{REF2}$, the resistor R1, and the resistor R2.

Since the charge pump system 1000 according to one embodiment generates the input voltage $V_{IN\_100}$ of the charge pump circuit 100 by feeding back the output voltage $V_{OUT\_100}$, the output voltage $V_{OUT\_100}$ may be maintained constant. Referring to Equation 5, since the reference voltage $V_{REF1}$ and the reference voltage $V_{REF2}$ are constant voltages, the output voltage $V_{OUT\_100}$ may be a stable constant voltage. Again, in the charge pump system 1000 of FIG. 1, the input voltage $V_{IN\_100}$ of the charge pump circuit 100 may be changed so that the output voltage $V_{OUT\_100}$ is constant.

In a general charge pump circuit (system), the output voltage may cause a deviation depending on the manufacturing process of the charge pump circuit and an external temperature. To prevent this, the input voltage (i.e., the power source voltage) of the charge pump circuit needs to be a high voltage. On the other hand, in the charge pump system 1000 according to one embodiment, since the output voltage $V_{OUT\_100}$ is fed back, the input voltage $V_{IN\_100}$ of the charge pump circuit 100 does not need to be a high voltage. That is, the input voltage $V_{IN\_100}$ of the charge pump system 1000 according to one embodiment may be set (designed) lower than the input voltage (the power source voltage) of the general charge pump circuit. Accordingly, a through current in the charge pump circuit 100 may be reduced, and a clock noise may be reduced.

Figure 2:
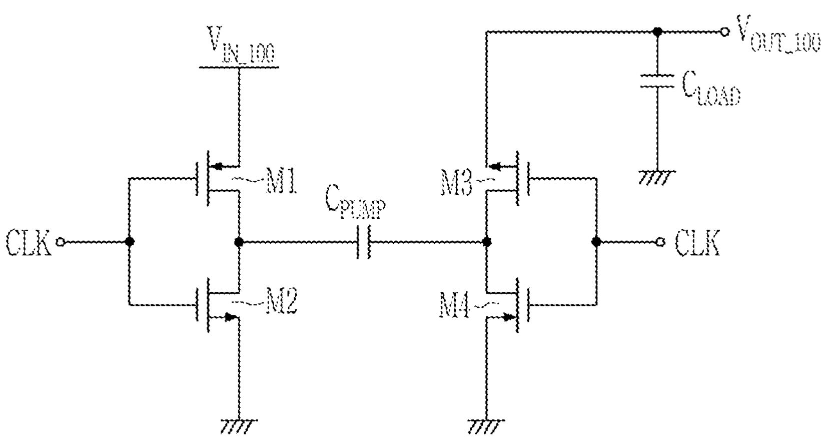
FIG. 2 is a diagram showing an example of a charge pump circuit of the charge pump system of FIG. 1.

FIG. 2 is a diagram showing an example of a charge pump circuit of the charge pump system of FIG. 1.

Referring to FIG. 2, the charge pump circuit 100 may include a transistor M1, a transistor M2, a transistor M3, a transistor M4, a pump capacitor $C_{PUMP}$, and a load capacitor $C_{LOAD}$.

In FIG. 2, the transistors M1 to M4 may be various types of transistors that perform a switching function, such as an field-effect transistor (FET) or a bipolar junction transistor (BJT). In the following description, it is assumed that the transistors M1 to M4 are FETs for convenience of description, but other types of transistors may be substituted. Also, in FIG. 2, the transistor M1 and the transistor M4 are P-type transistors, but may be N-type transistors, and the transistors M2 and the transistor M3 are N-type transistors, but may be P-type transistors. On the other hand, since the gate of the transistor serves as a control terminal, it may be referred to as a control terminal. Since the source of the transistor is one terminal of the transistor, it may be referred to as a first terminal or a second terminal. Also, since the drain of the transistor is also one terminal of the transistor, it may be referred to as a second terminal or a first terminal.

The source of the transistor M1 may be connected to the input voltage $V_{IN\_100}$, and the drain of the transistor M1 and the drain of the transistor M2 may be connected to each other. The source of the transistor M2 may be connected to a ground. Also, a clock signal CLK may be input to the gate of the transistor M1 and the gate of the transistor M2. The input voltage $V_{IN\_100}$ output from the transistor 300 may be a power source voltage of the charge pump circuit 100.

The source of the transistor M3 may be connected to one terminal of the load capacitor $C_{LOAD}$, and the output voltage $V_{OUT\_100}$ may be output from the source of the transistor M3. The drain of the transistor M3 and the drain of the transistor M4 may be connected to each other, and the source of the transistor M4 may be connected to the ground. Also, the clock signal CLK may be input to the gate of the transistor M3 and the gate of the transistor M4. The clock signal CLK applied to the gate of the transistor M3 and the gate of the transistor M4, and the clock signal CLK applied to the gate of the transistor M1 and the gate of the transistor M2, may be the same clock signal CLK.

One terminal of the pump capacitor $C_{PUMP}$ may be connected to the drain of the transistor M1 and the drain of the transistor M2. Also, the other terminal of the pump capacitor $C_{PUMP}$ may be connected to the drain of the transistor M3 and the drain of the transistor M4.

Also, the load capacitor $C_{LOAD}$ may be connected between the source of the transistor M3 and the ground. The load capacitor $C_{LOAD}$ may stabilize the output voltage $V_{OUT\_100}$ output by the charge pump circuit 100.

The charge pump circuit 100 may have two operation states. The first operation state is an operation to charge the pump capacitor $C_{PUMP}$, and the second operation state is an operation to output the output voltage $V_{OUT\_100}$ as a negative voltage. This is described with reference to FIG. 3A and FIG. 3B in more detail.

Figure 3A:
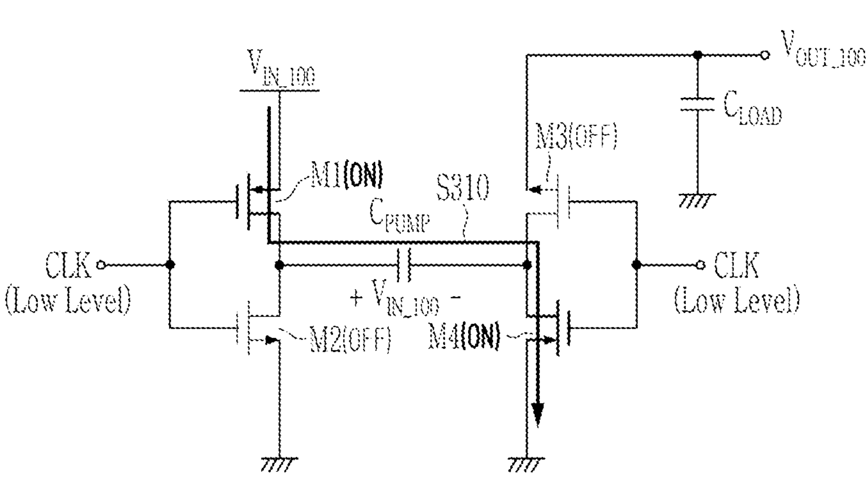
FIG. 3A is a diagram showing the charge pump circuit of FIG. 2 in a first operation state.

FIG. 3A is a diagram showing the charge pump circuit of FIG. 2 in a first operation state.

Referring to FIG. 3A, in a first operation state, the clock signal CLK may have a low level. By the clock signal CLK having the low level, the transistor M1 and the transistor M4 may be turned on, and the transistor M2 and the transistor M3 may be turned off. Accordingly, a current path S310 may be formed by the power source voltage VDD, the transistor M1, the pump capacitor $C_{PUMP}$, the transistor M4, and the ground. By the current path S310, the pump capacitor $C_{PUMP}$ may be charged with the input voltage $V_{IN\_100}$.

Figure 3B:
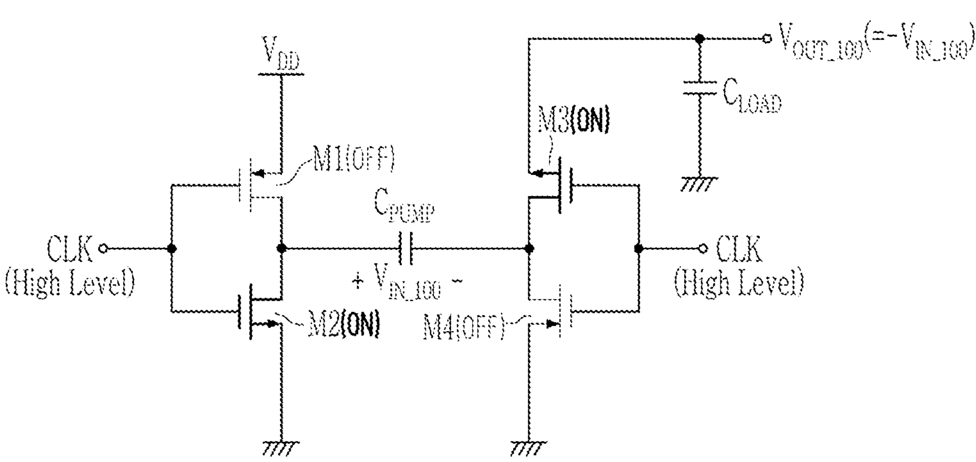
FIG. 3B is a diagram showing the charge pump circuit of FIG. 2 in a second operation state.

FIG. 3B is a diagram showing the charge pump circuit of FIG. 2 in a second operation state.

Referring to FIG. 3B, in the second operation state, the clock signal CLK may have a high level. By the clock signal CLK having the high level, the transistor M2 and the transistor M3 may be turned on, and the transistor M1 and the transistor M4 may be turned off. The pump capacitor $C_{PUMP}$ maintains the input voltage $V_{IN\_100}$ to which the pump capacitor $C_{PUMP}$ Was charged during the first operation state, and one terminal of the pump capacitor $C_{PUMP}$ IS connected to the ground through the transistor M2. Accordingly, the voltage on the other terminal of the pump capacitor $C_{PUMP}$ becomes $-V_{IN\_100}$, and an output voltage $V_{OUT\_100}$ Of $-V_{IN\_100}$ may be output. That is, the output voltage $V_{OUT\_100}$ equal to $-V_{IN\_100}$ may be output through the load capacitor $C_{LOAD}$. Since a turn-on resistance may occur during the operation of the transistors M1 to M4, and the voltage drop due to the turn-on resistance may occur, the output voltage $V_{OUT\_100}$ may be higher than $-V_{IN\_100}$.

The first operation state and the second operation state may be repeated a plurality of times by the clock signal CLK. By this repeated operation, the charge pump circuit 100 may output the output voltage $V_{OUT\_100}$, which is a negative voltage substantially equal to $-V_{IN\_100}$.

As described above, in FIG. 2, the input voltage $V_{IN\_100}$ does not need to be set to a high value, so a flow-through current by the current path S310 of FIG. 3A may be reduced. As a result, a noise caused by the clock signal CLK may be reduced, and a stable output voltage $V_{OUT\_100}$ may be generated.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A charge pump system comprising:

a charge pump circuit comprising an input terminal configured to receive an input voltage, and an output terminal configured to output an output voltage, the charge pump circuit being configured to convert the input voltage to the output voltage;

a first resistor comprising one terminal connected to a reference voltage;

a second resistor connected between another terminal of the first resistor and the output terminal of the charge pump circuit;

a third resistor comprising one terminal connected to the reference voltage;

a fourth resistor connected between another terminal of the third resistor and a ground;

an amplifier comprising a first input terminal connected to the other terminal of the first resistor, a second input terminal connected to the other terminal of the third resistor, and an output terminal; and a first transistor comprising a control terminal connected to the output terminal of the amplifier, and a first terminal connected to the input terminal of the charge pump circuit.

2. The charge pump system of claim 1, wherein the output voltage of the charge pump circuit depends on a value of the reference voltage and resistance values of the first to fourth resistors.

3. The charge pump system of claim 1, wherein a voltage at a node between the first resistor and the second resistor is applied to the first input terminal of the amplifier, and a voltage at a node between the third resistor and the fourth resistor is applied to the second input terminal of the amplifier.

4. The charge pump system of claim 1, wherein the first transistor is configured to supply the input voltage of the charge pump circuit to the input terminal of the charge pump circuit through the first terminal of the first transistor.

5. The charge pump system of claim 1, wherein the first transistor further comprises a second terminal configured to be connected to a power source voltage.

6. The charge pump system of claim 5, wherein the control terminal of the first transistor is a gate, the first terminal of the first transistor is a drain, and the second terminal of the first transistor is a source.

7. The charge pump system of claim 1, wherein the reference voltage is a power source voltage supplied from outside the charge pump system.

8. The charge pump system of claim 1, wherein the input voltage of the charge pump circuit is a positive voltage, and the output voltage of the charge pump circuit is a negative voltage.

9. The charge pump system of claim 1, wherein the amplifier is an operational amplifier, the first input terminal of the amplifier is a non-inverting terminal of the operational amplifier, and the second input terminal of the amplifier is an inverting terminal of the operational amplifier.

10. A charge pump system comprising:

a charge pump circuit comprising an input terminal configured to receive an input voltage, and an output terminal configured to output an output voltage, the charge pump circuit being configured to convert the input voltage to the output voltage;

a transistor comprising a control terminal configured to receive a control voltage, and a first terminal connected to the input terminal of the charge pump circuit to provide the input voltage to the input terminal of the charge pump circuit, the transistor being configured to generate the input voltage based on the control voltage;

an amplifier comprising a first input terminal configured to receive a feedback voltage, a second input terminal configured to receive a first reference voltage, and an output terminal connected to the control terminal of the transistor to provide the control voltage to the control terminal of the transistor, the amplifier being configured to generate the control voltage based on the feedback voltage and the first reference voltage;

a first voltage divider connected between a terminal configured to receive a second reference voltage and the output terminal of the charge pump circuit and configured to generate the feedback voltage and output the feedback voltage to the first input terminal of the amplifier; and a second voltage divider connected between the terminal configured to receive the second reference voltage and a ground and configured to generate the first reference voltage and output the first reference voltage to the second input terminal of the amplifier.

11. The charge pump system of claim 10, wherein the amplifier is an operational amplifier, the first input terminal of the amplifier is a non-inverting input terminal of the operational amplifier configured to receive the feedback voltage, the second input terminal of the amplifier is an inverting input terminal of the operational amplifier configured to receive the first reference voltage, and the operational amplifier is configured to generate the control voltage based on the feedback voltage and the first reference voltage.

12. The charge pump system of claim 10, wherein the first voltage divider comprises:

a first resistor connected between the terminal configured to receive the second reference voltage and a first node connected to the first terminal of the amplifier; and a second resistor connected between the first node and the output terminal of the charge pump circuit, wherein the first voltage divider is configured to generate the feedback voltage at the first node based on a first voltage difference between the second reference voltage and the output voltage of the charge pump circuit output from the output terminal of the charge pump circuit, and the second voltage divider comprises:

a third resistor connected between the terminal configured to receive the second reference voltage and a second node connected to the second input terminal of the amplifier; and a fourth resistor connected between the second node and the ground, wherein the second voltage divider is configured to generate the first reference voltage at the second node based on a second voltage difference between the second reference voltage and a voltage of the ground.

13. The charge pump system of claim 10, wherein the input voltage of the charge pump circuit is a positive voltage, and the output voltage of the charge pump system is a negative voltage.

* * * * *